United States Patent
Peterson

[19]

[11] Patent Number: 5,898,242
[45] Date of Patent: Apr. 27, 1999

[54] SELF-CALIBRATING CLOCK CIRCUIT EMPLOYING A CONTINUOUSLY VARIABLE DELAY MODULE IN A FEEDBACK LOOP

[75] Inventor: LuVerne Ray Peterson, San Diego, Calif.

[73] Assignee: Unisys Corporation, Blue Bell, Pa.

[21] Appl. No.: 08/032,758

[22] Filed: Mar. 17, 1993

Related U.S. Application Data

[63] Continuation of application No. 07/785,895, Oct. 30, 1991, abandoned, which is a continuation of application No. 07/504,776, Apr. 4, 1990, abandoned.

[51] Int. Cl.$^6$ .................................................. H03H 11/26
[52] U.S. Cl. ...................... 327/278; 327/263; 327/276; 327/277; 327/155; 327/394; 327/170
[58] Field of Search ................................. 307/265, 266, 307/267, 480, 481, 597, 601, 603, 605, 263, 269, 594; 328/63; 327/155, 170, 172, 173, 174, 263, 276, 277, 278, 393, 394; 326/93, 95

[56] References Cited

U.S. PATENT DOCUMENTS

| | | | |
|---|---|---|---|
| 4,465,945 | 8/1984 | Yin | 307/270 |
| 4,496,861 | 1/1985 | Bazes | 307/603 |
| 4,517,473 | 5/1985 | Chidester | 307/597 |
| 4,563,594 | 1/1986 | Koyama | 307/603 |
| 4,595,848 | 6/1986 | Ryczek | 307/597 |
| 4,652,778 | 3/1987 | Hosoya et al. | 307/603 |
| 4,700,089 | 10/1987 | Fujii et al. | 307/603 |
| 4,719,369 | 1/1988 | Asano et al. | 307/263 |
| 4,728,820 | 3/1988 | Lee | 307/601 |
| 4,785,201 | 11/1988 | Martinez | 307/263 |
| 4,818,901 | 4/1989 | Young et al. | 307/263 |
| 4,825,101 | 4/1989 | Walters, Jr. | 307/263 |
| 4,855,623 | 8/1989 | Flaherty | 307/491 |
| 4,922,141 | 5/1990 | Lofgren et al. | 307/603 |
| 4,961,010 | 10/1990 | Davis | 307/263 |
| 4,970,408 | 11/1990 | Hanke et al. | 307/597 |
| 5,087,829 | 2/1992 | Ishibashi et al. | 307/269 |

OTHER PUBLICATIONS

Nilsson; "Electric Circuits"; 1983; p. 153.

*Primary Examiner*—Terry D. Cunningham
*Attorney, Agent, or Firm*—Charles J. Fassbender; Mark T. Starr; Steven R. Petersen

[57] ABSTRACT

A clock deskew circuit comprises a variable delay module and a control module. Included in the variable delay module are an input terminal for receiving a digital input clock signal, a control terminal for receiving an analog control signal, and a delay circuit which propagates the input clock signal from the input terminal to a buffer such that certain type signal edges (i.e., rising edges or falling edges) are delayed for a time interval which is varied in a continuous fashion by the magnitude of the control signal. Included in the control module is a feedback lead which receives the delayed clock signal from the buffer of the delay module, another lead which carries the input clock signal, and a control signal generating circuit. This control signal generating circuit sends the control signal to the control terminal of the delay module with a magnitude that increases the delay time interval when the delayed clock edges from the buffer lag the corresponding input clock edges by less than one clock cycle, and vice versa.

10 Claims, 4 Drawing Sheets

SELF-CALIBRATING CLOCK CIRCUIT EMPLOYING A CONTINUOUSLY VARIABLE DELAY MODULE IN A FEEDBACK LOOP

This is a continuation of application Ser. No. 07/785,895 filed on Oct. 30, 1991, now abandoned, which is a continuation of application Ser. No. 07/504,776 filed on Apr. 4, 1990, now abandoned.

BACKGROUND OF THE INVENTION

This invention relates to circuits for receiving a clock signal and generating multiple buffered duplications of the received clock signal such that any skew between the duplicated signals is minimal. Such a circuit is herein called a clock deskew circuit.

A primary use of the clock deskew circuit is in a multi-chip clocked logic system. In such a system, a clocked flip-flop "A" which is located on one chip often has an output which goes to an input of a clocked flip-flop "B" which is located on another chip. If the edge of the clock signals which trigger those two flip-flops do not occur at precisely the same time, a race condition can occur which will cause logic errors. For example, if flip-flop "A" is clocked early while flip-flop "B" is clocked late, the input to flip-flop "B" might change just as that flip-flop is being clocked.

To provide clock signals for the flip-flops on all of the chips which are precisely synchronized to each other is not an easy task. In particular, a single clock signal cannot simply be sent to each of the chips and there duplicated as many times as needed by multiple clock buffers. That is because the time delay through a clock buffer will unavoidably vary from one chip to another; and that variance in time delay will produce a skew between the buffered clock signals. Differences in time delay through the buffers are unavoidable because they are caused by many minute process variations which occur as the chips are fabricated.

In the prior art, the problem of dealing with clock skew is addressed in U.S. Pat. No. 4,637,018. However, the clock deskew circuit of that patent can only deskew the buffered clock signals in certain predetermined increments. For example, if a clock edge occurs too late, it is sped up by a certain fixed increment of time. But, depending on how late the clock edge was to begin with, that fixed increment of time may be too large. Further, since the minimal size of this fixed increment is limited, the degree to which it affects clock skew increases as the cycle time of the clock decreases. Consequently, for very high speed clocked logic systems, this patent has little or no value.

Also in the prior art, the clock deskew problem is addressed in U.S. Pat. No. 4,494,021. In this patent, the skew between buffered clock signals on different chips is reduced in a continuous fashion through the use of a voltage-controlled oscillator (VCO) which operates in conjunction with the variable delay line. However, with a VCO, the clock signal cannot be stopped since a VCO has an internal feedback loop which causes it to always oscillate. Being able to stop the clock is, however, a useful feature for various purposes—such as for doing maintenance on the clocked logic system and for putting the clocked logic system in a temporary wait state until some needed response from another external source is received.

Further, the amount of circuitry that is required to implement the '021 clock deskew circuit is quite large since the VCO circuitry is essentially doubled by the delay line circuitry. Also with patent '021, the delay line lies external to the VCO feedback loop, and thus the time delay through the delay line is not self-calibrating. Instead, the delay through the delay line is set by the operation of the VCO and by making the delay line stages identical to the VCO stages. However, in a mass production environment, the delay line stages and the VCO stages cannot always be exactly alike due to unavoidable processing variations, impedance loading variations, and mask variations.

Accordingly, the primary object of the invention is to provide an improved clock deskew circuit in which all of the above described problems are eliminated.

BRIEF SUMMARY OF THE INVENTION

In accordance with the invention, a clock deskew circuit comprises a variable delay module and a control module. Included in the variable delay module are an input terminal for receiving a digital input clock signal, a control terminal for receiving an analog control signal, and a delay circuit which propagates the input clock signal from the input terminal to a buffer such that certain type signal edges (i.e., rising edges or falling edges) are delayed for a time interval which is varied in a continuous fashion by the magnitude of the control signal. Included in the control module is a feedback lead which receives the delayed clock signal from the buffer of the delay module, another lead which carries the input clock signal, and a control signal generating circuit. This control signal generating circuit sends the control signal to the control terminal of the delay module with a magnitude that increases the delay time interval when the delayed clock edges from the buffer lag the corresponding input clock edges by less than one clock cycle, and vice versa.

In a multi-chip system, the above clock deskew circuit is put on each chip of the system. Then, since the variable delay module together with the control module delay input clock edges in a continuous fashion by exactly one cycle, it follows that the delayed clock edges on all of the chips occur at exactly the same time. Further, since the clock deskew circuit contains no VCO, the delayed clock signal edges stop when the input clock signal edges stop. Also, since the delay module is a part of the feedback loop with the control module, it follows that the delay through the delay module is self-calibrating to exactly one cycle and is not subject to process variations and/or mask variations.

BRIEF DESCRIPTION OF THE DRAWINGS

Various features and advantages of the invention are described herein in conjunction with the accompanying drawings wherein.

DETAILED DESCRIPTION OF THE INVENTION

Figure 1:
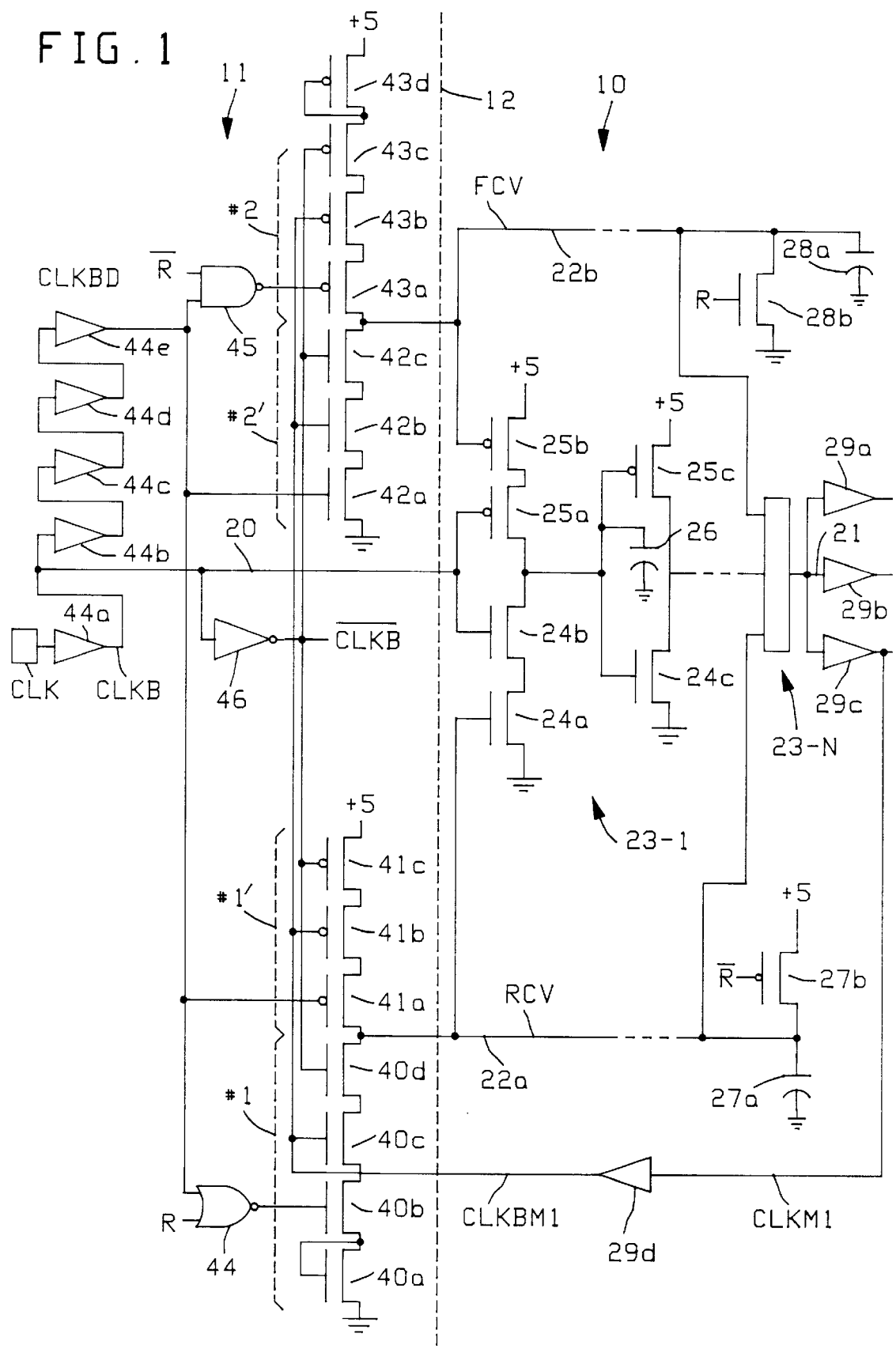
FIG. 1 is a detailed circuit diagram of one preferred clock deskew circuit which is constructed according to the invention.

Referring now to FIG. 1, a preferred embodiment of a clock deskew circuit which is constructed in accordance with the invention is there illustrated. This clock deskew circuit is comprised of a voltage controlled delay module 10, and a control module 11 which is coupled to the voltage controlled delay module. A dashed line 12 in FIG. 1 delineates these two modules.

Delay module 10 has an input terminal 20, an output terminal 21, a rise control terminal 22a, and a fall control terminal 22b. Interconnected in series between the input terminal 20 and the output terminal 21 are N delay stages 23-1 thru 23-N, where N is a predetermined integer. These delay stages are identical in their construction; and thus, the components which make up only one of the delay stages 23-1 are shown. Those components are three N-channel transistors 24a thru 24c, three P-channel transistors 25a thru 25c, and a capacitor 26. All of these components are interconnected as shown.

Delay module 10 further includes a capacitor 27a and a P-channel transistor 27b which are coupled to the rise control terminal 22a as shown. Also it includes a capacitor 28a and an N-channel transistor 28b which are coupled to the full control terminal 22b as shown. Lastly, control module 10 includes output buffers 29a, 29b, and 29c which are coupled in parallel to the output terminal 21, and one other buffer 29d which is a feedback to the control module 11.

In operation, a clock signal CLKB from the control module 11 is applied to the input terminal 20 of the variable delay module 10. That clock signal CLKB then propagates through all of the delay stages 23-1 thru 23-N to the output terminal 21. During that propagation, rising clock edges are delayed for a time interval which can be varied in a continuous fashion by the magnitude of a rise control voltage RCV on the rise control terminal 22a. Also during that propagation, falling clock signal edges are delayed for a time interval which can be varied in a continuous fashion by the magnitude of a fall control voltage FCV on the fall control terminal 22b.

Additional details on how the various components within the variable delay module 10 operate to actually delay the input clock signal in response to the RCV and FCV signals will be described shortly in conjunction with FIGS. 2 and 3. Firstly, however, consider the makeup of control module 11 whose function is to produce the RCV and FCV control signals.

Included in the control module 11 are four N-channel transistors 40a thru 40d, and three P-channel transistors 41a thru 41c. Those transistors are serially coupled together as shown, and they produce the rise control voltage RCV. Further included in the control module 11 are three N-channel transistors 42a–42c, and four P-channel transistors 43a–43d. Those transistors are serially coupled together as shown, and they produce the fall control voltage FCV.

Lastly included in the control module 11 are five serially interconnected buffers 44a thru 44e, a NOR gate 45, a NAND gate 46, and an inverter 47. These gates receive a digital clock signal CLK from an external source (not shown); and they send a clock signal CLKB to the variable delay module 10; and they generate various timing signals for the transistors 40b, 40d, 41a, 41c, 42a, 42c, 43a and 43c. At the same time, the transistors 40c, 41b, 42b, and 43b receive a feedback signal CLKBM1 from buffer 29d of delay module 10. As signal CLKB is passed through the delay module 10, these transistors operate to generate the control signals RCV and FCV such that precisely one cycle of delay occurs between the feedback clock signal CLKBM1 and signal CLKB. Thus, rising edges in clock signal CLKB occur at the same time as rising edges in the clock signal CLKBM1; and falling edges in clock signal CLKB occur at the same time as falling edges in the clock signal CLKBM1.

Figure 2:
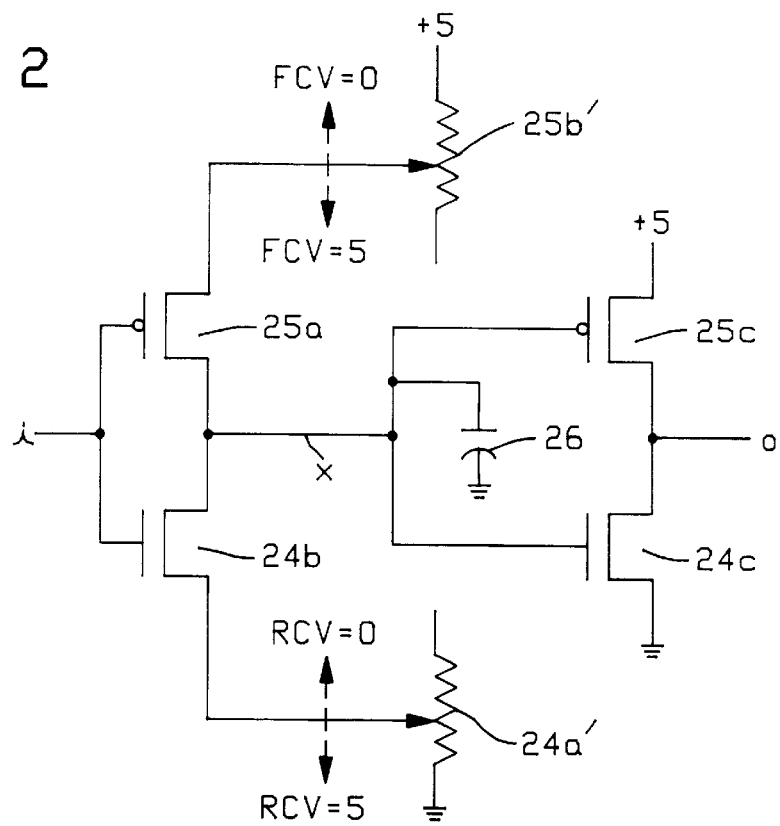
FIG. 2 shows a circuit which illustrates the operation of a delay module that lies within the FIG. 1 clock deskew circuit.
Figure 3:
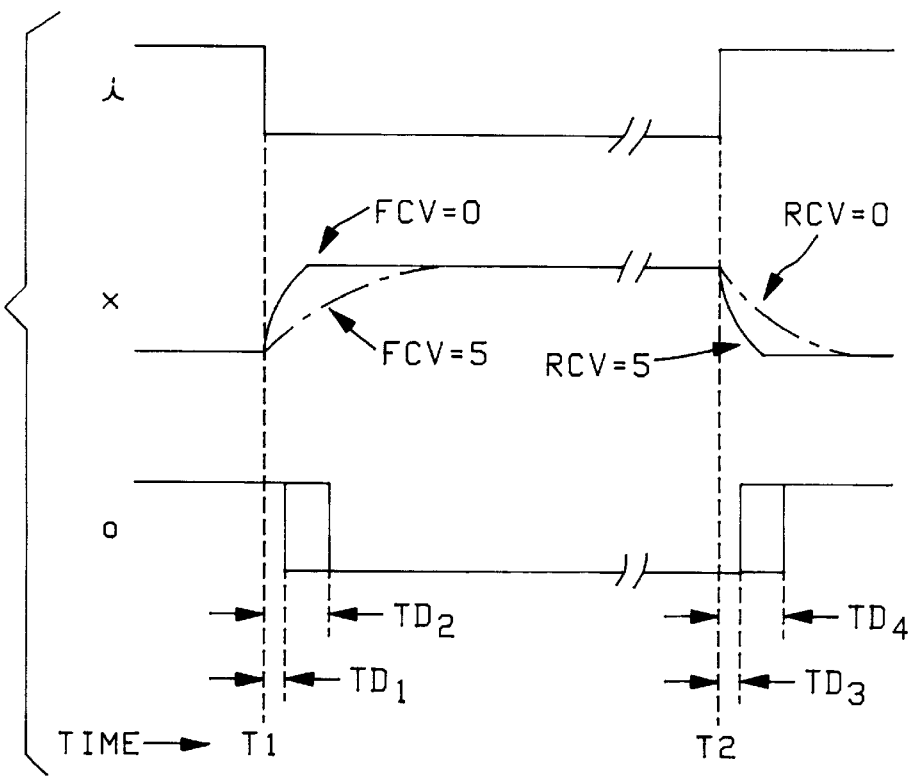
FIG. 3 is a set of voltage waveforms which occur within the FIG. 2 circuit.

Turning now to FIGS. 2 and 3, they show how the various components within each of the delay stages 23-1 thru 23-N operate to delay the clock signal CLKB. In FIG. 2, the components of stage 23-1 are the same as shown in FIG. 1 except that transistors 24a and 25b are drawn as voltage controlled resistors 24a' and 25b'. Transistor 24a operates as the voltage controlled resistor 24a' because the rise control voltage RCV is an analog signal which varies in magnitude between zero volts and five volts. When signal RCV is at zero volts, transistor 24a has a very large source-drain resistance; and that source-drain resistance is reduced in proportion to the magnitude of the RCV signal.

Transistor 25b also operates as the voltage controlled resistor 25b' because the fall control voltage FCV is an analog signal which varies in magnitude between zero volts and five volts. When signal FCV is at zero volts, transistor 25b has a very small source-drain resistance; and, that source-drain resistance is increased in proportion to the magnitude of the FCV signal.

How the voltage controlled resistors 24a' and 25b' affect the propagation delay of a signal through the FIG. 2 circuit is shown in FIG. 3. There, "i" indicates the input signal to the FIG. 2 circuit; "o" indicates the output signal from the FIG. 2 circuit; and "x" indicates a signal which occurs internal to the FIG. 2 circuit on capacitor 26.

At time instant $T_1$, a falling edge occurs in the input signal i. When signal i is low, transistor 24b is off and transistor 25a is on. Thus, capacitor 26 is charged through voltage controlled resistor 25b' and transistor 25a. If the resistance of resistor 25b' is small, capacitor 26 will charge quickly; and that in turn will cause the output signal o to switch after a short time delay $TD_1$. As the resistance of resistor 25b' increases, capacitor 26 will charge slower; and that in turn will cause the output signal o to switch after a longer time delay $TD_2$.

At time instant $T_2$, a rising edge occurs in the input signal i. When signal i is high, transistor 24b is on and transistor 25a is off. Thus, capacitor 26 is discharged through voltage controlled resistor 24a' and transistor 24b. If the resistance of resistor 24a' is small, capacitor 26 will discharge quickly; and that in turn will cause the output signal o to switch after a short time delay $TD_3$. As the resistance of resistor 24a' is increased, capacitor 26 will discharge slower; and that in turn will cause the output signal o to switch after a longer time delay $TD_4$.

Figure 4:
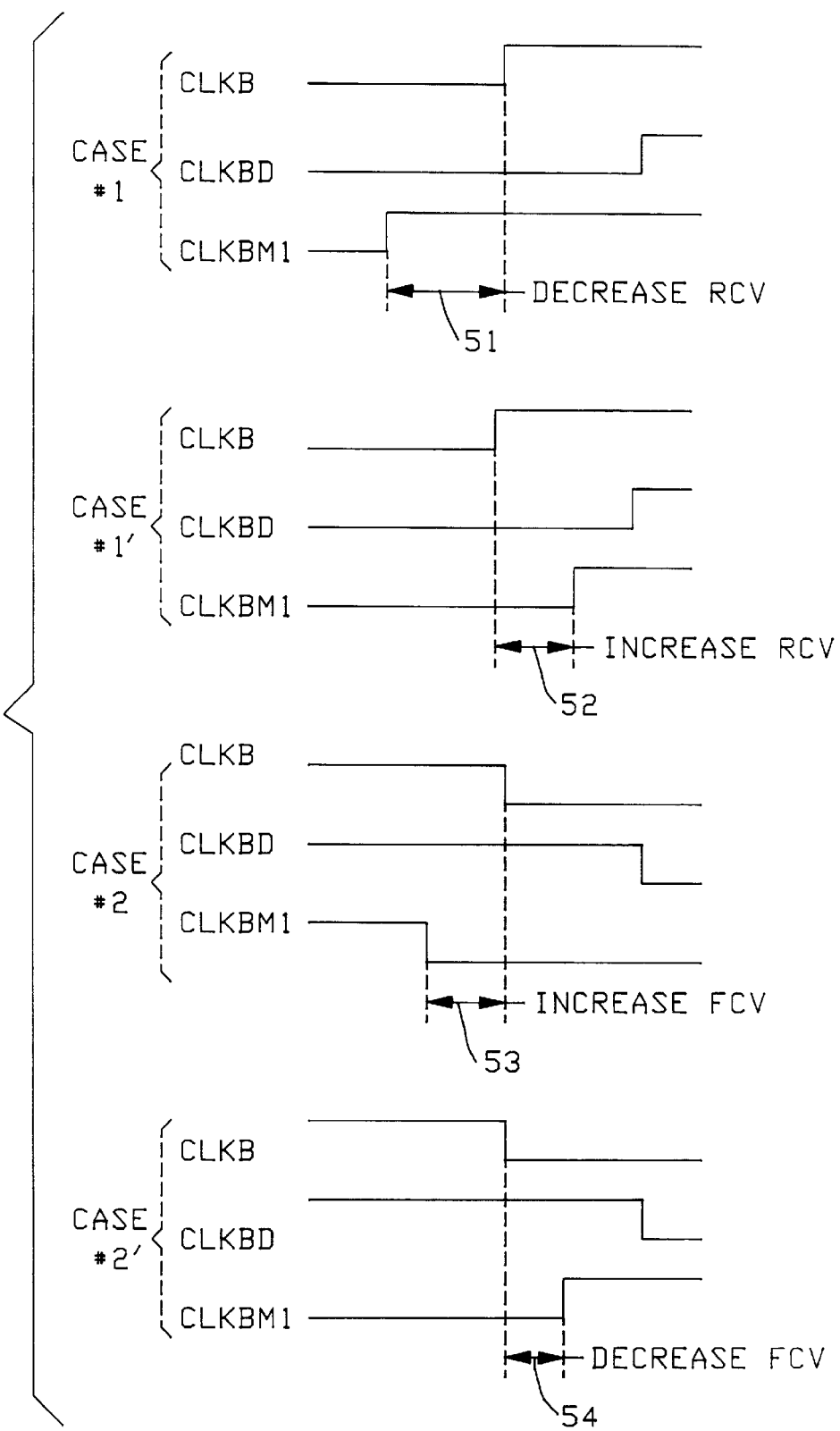
FIG. 4 shows four sets of voltage waveforms which illustrate the operation of a control module that lies within the FIG. 1 clock deskew circuit.

Next, referring to FIG. 4, it shows four sets of voltage waveforms for some of the signals in the FIG.1 circuit. These four sets of signals illustrate how the control module 11 generates the rise control voltage RCV and fall control voltage FCV with proper magnitudes. In FIG. 4, the four sets of signals are labeled #1, #1', #2, and #2'; and, in FIG. 1, that same labeling identifies which portions of the control module 11 are activated by those four signal sets.

Consider first the signals of set #1. There, a rising edge in clock signal CLKBM1 is delayed by delay module 10 for less than one cycle. For the rising edge of signal CLKBM1 to be delayed by exactly one cycle, the time delay for rising edges through delay module 10 needs to be increased. This is achieved by decreasing the magnitude of the rise control voltage RCV during the time interval 51 as shown in FIG. 4. In the FIG. 1 control module, this is achieved by all of the transistors which are labeled #1.

Next, consider the signals of set #1'. There, a rising edge in clock signal CLKBM1 is delayed by the delay module 10 for more than one cycle. For the rising edge of signal CLKBM1 to be delayed by exactly one cycle, the time delay for rising edges through the delay module 10 needs to be decreased. Such a decrease is achieved by increasing the rise control voltage RCV during a time interval 52 as shown in FIG. 4. That voltage increase is achieved by the transistors #1' in FIG. 1.

Next, in the signals of set #2, a falling edge in the clock signal CLKBM1 is delayed by the delay module 10 for less than one clock cycle. For the falling edge of signal CLKBM1 to be delayed by exactly one cycle, the delay of a falling edge through module 10 needs to be increased. This increased delay is achieved by increasing the fall control voltage FCV during a time interval 53 as shown in FIG. 4. That voltage increase is produced by the transistors #2 in FIG. 1.

Lastly, in the signals of set #2', a falling edge in the clock signal CLKBM1 is delayed by the delay module 10 for more than one clock cycle. For the falling edges of signal CLKBM1 to be delayed by exactly one cycle, the delay of a falling edge through module 10 needs to be decreased. Such a decrease is achieved by decreasing the magnitude of the fall control voltage FCV during a time interval 54 in FIG. 4. That voltage decrease is achieved by the transistors #2' in FIG. 1.

One aspect of the FIG. 1 circuit which remains to be explained is the function of the R signal and its complement. Signal R is a reset signal which is used to initialize the FIG. 1 circuit. When signal R is true (a logical "1"), transistors 27b and 28b are on and transistors 40b and 43a are off. As a result, capacitor 27a is charged to five volts while capacitor 28a is discharged to zero volts. These initialized values of the rise control voltage RCV and fall control voltage FCV minimize the delay with which rising clock edges and falling clock edges pass through the delay module 10. Thereafter, when the reset signal R goes false, transistors 27b and 28b turn off; and that enables the rise and fall control voltages RCV and FCV on the capacitors 27a and 28a to be varied by the transistors #1, #1', #2, and #2' as was described above.

Due to the operation of the transistors #1 and #1', rising clock edges in the signals CLKB and CLKBM1 will occur simultaneously; and, due to the operation of the transistors #2 and #2', falling clock edges in the signals CLKB and CLKBM1 will also occur simultaneously. Inspection of FIG. 1 shows that signal CLKB differs from signal CLK by the delay of one gate 44a, and signal CLKBM1 differs from signal CLKM1 by the delay of one gate 29d. Consequently, if the delays of just the two gates 44a and 29d are equal, rising and falling edges in clock signal CLKM1 occur at the same time as rising and falling edges in clock signal CLK.

A primary feature of the above-described FIG. 1 circuit is that it can be used to synchronize a multi-chip clocked logic system with essentially zero skew. In such a system, the FIG. 1 circuit is put on each of the chips. Signal CLK is distributed to the FIG. 1 circuit on each of the chips, and each chip generates clock signals for its own internal use from the outputs of the buffers 29a thru 29c. Since signal CLKM1 on each chip is delayed by precisely one cycle from signal CLK, it follows that the rising and falling edges in the CLKM1 signals on all of the chips occur at exactly the same time. Consequently, logic races between chips are avoided.

Another feature of the FIG. 1 circuit is that the above result is achieved even if the impedance loading of the delay module stages varies from chip to chip, or if the processing of the FIG. 1 circuit varies from chip to chip, or if mask variations in the FIG. 1 circuit occur from chip to chip. This is because the delay module 10 and the control module 11 together form one feedback loop which self-calibrates the delay through module 11 to exactly one cycle.

Another feature of the FIG. 1 circuit is that if the input clock signal CLK is purposely stopped, then the output clock signal CLKM1 also stops. Thereafter, if the input clock signal CLK restarts, then the output clock signal CLKM1 also restarts. Clock stopping and/or restarting can occur in various situations, such as when maintenance is being performed or when an external response is needed before the clocked system can continue. By comparison, when a system clock is generated with a voltage controlled oscillator (VCO), the system clock cannot be stopped because a VCO always oscillates at some frequency.

Still another feature of the FIG. 1 circuit is that the duty cycle of the output clock signal CLKM1 is identical to the duty cycle of the input clock signal CLK. This occurs since rising edges and falling edges in signal CLK are delayed by one cycle. Having a clock with a particular duty cycle is important in many clocked logic systems, such as those where some flip-flops are triggered with rising clock edges while other flip-flops are triggered with falling clock edges. By comparison, the control voltage to a VCO controls just the frequency and not the duty cycle of the clock signal from the VCO.

Figure 5:
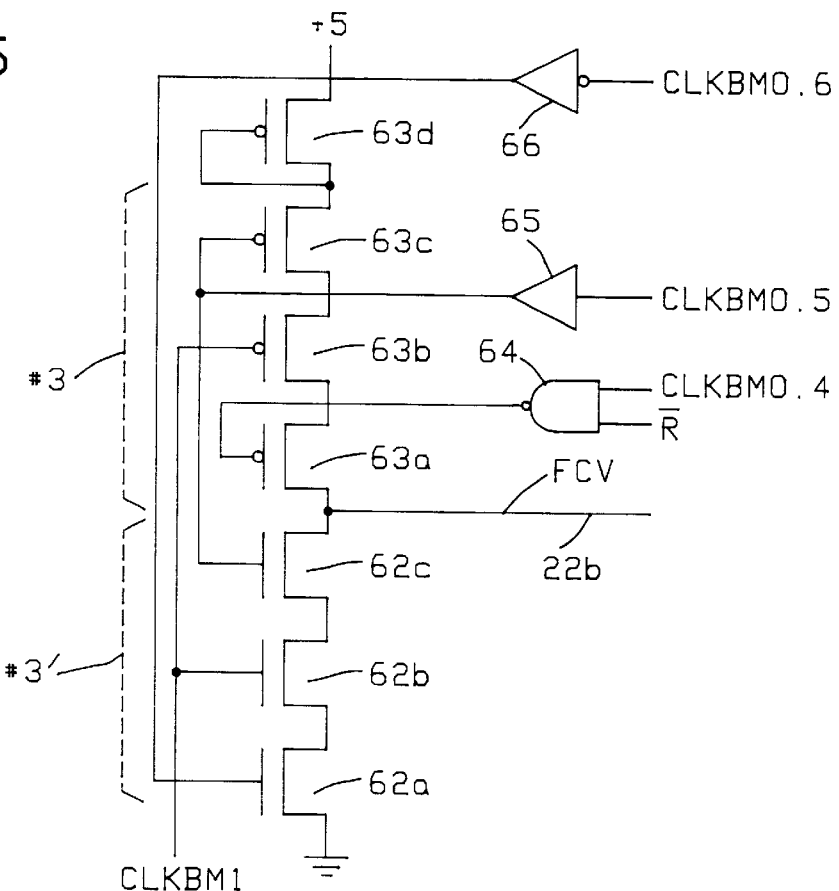
FIG. 5 is a circuit diagram of a modification for the FIG. 1 clock deskew circuit; and, FIG. 6 shows two sets of voltage waveforms which illustrate the operation of the FIG. 5 modification.

Turning now to FIG. 5, it shows a modification to the FIG. 1 circuit. This FIG. 5 modification replaces all of the FIG. 1 circuitry which produces the fall control voltage FCV. That is, the FIG. 5 circuitry replaces the FIG. 1 transistors 42a–42c and 43a–43d plus NAND gate 45. All of the other circuitry in FIG. 1 remains unchanged.

Included in the FIG. 5 modification are three N-channel transistors 62a, 62b, and 62c as well as four P-channel transistors 63a, 63b, 63c and 63d. All of these transistors are serially interconnected as shown. Further included in the FIG. 5 modification are a NAND gate 64, a buffer 65, and an inverter 66. These gates respectively receive clock signals CLKBM0.4, CLKBM0.5, and CLKBM0.6. Signal CLKBM0.5 is generated by the stage of delay module 10 which is located halfway through the series of stages 23-1 thru 23-N; signal CLKBM0.4 is generated by the stage of module 10 which is located approximately four-tenths of the way through the stages 23-1 thru 23-N; and, signal CLKBM0.6 is generated by the stage in module 10 which is located approximately six-tenths of the way through the stages 23-1 thru 23-N.

In operation, the FIG. 5 modification generates the fall control voltage FCV such that the duty cycle of clock signal CLKBM1 is 50%, regardless of the duty cycle of clock signal CLKB. How this result is achieved is illustrated by the signal waveforms of FIG. 6. There, the set of clock signals which are labeled #3 cover the situation where the duty cycle of signal CLKB is less than 50%. Also in signals of set #3, the rising edge of the clock signals CLKB and CLKBM1 occur at the same time since that result is achieved by the rise control voltage transistors #1 and #1' as was explained above; and, the rising edge of signal CLKBM0.5 occurs midway between the rising edges of the clock signals CLKB and CLKBM1 since signal CLKBM0.5 is taken from the stage of the delay module 10 which lies midway between the series of stages 23-1 thru 23-N.

What needs to be achieved by the FIG. 5 circuit when it operates on the signals of set #3 is to generate the fall control voltage FCV such that the falling edges of clock signal CLKBM1 are moved to the right until they coincide with the rising edges of clock signal CLKBM0.5. This is done by increasing the fall control voltage during a time interval 71 as shown in FIG. 6A. Such an increase in the fall control voltage is produced by the transistors of set #3 in FIG. 5.

Figure 6:
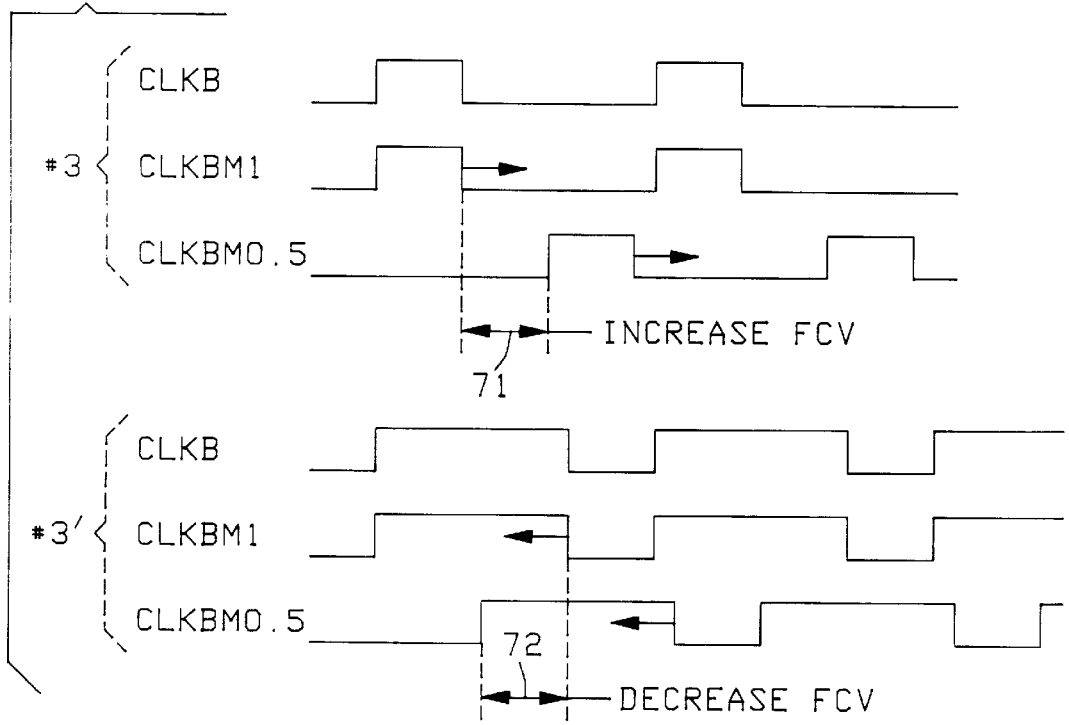

Next in FIG. 6, consider the set of clock signals that are labeled #3'. They cover the situation where the duty cycle of clock signal CLKB is more than 50%. To generate the clock signal CLKBM1 such that it has a 50% duty cycle, the falling edge of that signal needs to be moved to the left until they coincide with the rising edge of signal CLKBM0.5. This is achieved by decreasing the fall control voltage FCV during the time interval 72 as shown in FIG. 6B. Such a voltage decrease is achieved by the set of transistors which are labeled #3' in FIG. 5.

Various preferred embodiments of the invention have now been described in detail. In addition, however, many changes and modifications can be made to these embodiments without departing from the nature and spirit of the invention.

For example, suppose that only the rising edges of the signals CLKBM1 and CLK need to coincide, and that the falling edges of those two signals can be asynchronous with respect to each other. In that case, all of the transistors of the FIG. 1 control module 11 which produce the fall control voltage FCV can be eliminated and replaced with a fixed bias that is applied to the gate of the transistors 25b. Likewise, if only the falling edges of signals CLKBM1 and CLK need to coincide, then all of the transistors of the FIG. 1 control module 11 which produce the rise control voltage RCV can be eliminated and replaced with a fixed bias that is applied to the gate of the transistors 24a.

As another modification, the FIG. 1 capacitors 26, 27a, and 27b can be either discrete components which occupy their own separate portion of the chip on which the FIG. 1 circuit is formed, or they can be distributed parasitic capacitors that accompany the gates of the transistors 24a, 24c, 25a, and 25c. Each such transistor gate has a capacitance of about 50–100 femtofarads. That will produce a variable delay within each of the stages 23-1 thru 23-N of about ½ nanosecond min to 1½ nanoseconds max, and will set the magnitude of capacitors 27a and 28a at (50–100)N femtofarads.

Accordingly, it is to be understood that the invention is not limited to these detailed embodiments but is defined by the appended claims.

What is claimed is:

1. A clock deskew circuit, comprising:

a voltage controlled delay module having an input terminal for receiving a cyclic digital input clock signal that has first type edges and second type edges, a first control terminal for receiving a first control signal and a second control terminal for receiving a second control signal, and a delay means which propagates said input clock signal from said input terminal to an output terminal such that a) said first type signal edges are delayed between said input and output terminals with a first delay which is variable in a continuous fashion by the magnitude of said first control signal and b) said second type signal edges are delayed between said input and output terminals with a second delay which is variable in a continuous fashion independent of said first delay by the magnitude of said second control signal;

a control module having a feedback lead which is coupled to receive the delayed clock signal from said output terminal of said delay module, and having another lead which is coupled to receive said input clock signal;

said control module further including a first control signal generating means which sends said first control signal to said first control terminal of said delay module with a magnitude that increases said first delay when the delayed clock edges of said first type lag the corresponding input clock edges by less than one clock cycle, and vice versa; and, said control module also including a second control signal generating means which generates said second control signal with a magnitude that is not determined by the magnitude of said first control signal and vice-versa.

2. A clock deskew circuit according to claim 1 wherein said first type signal edges are rising signal edges and said second type signal edges are falling signal edges.

3. A clock deskew circuit according to claim 1 wherein said first type signal edges are falling signal edges and said second type signal edges are rising signal edges.

4. A clock deskew circuit according to claim 1 wherein said first control signal generating means generates said first control signal with an amplitude that decreases when rising clock edges from said output terminal lag corresponding edges on said input terminal by less than one clock cycle, and vice versa; and said second control signal generating means generates said second control signal with a fixed amplitude.

5. A clock deskew circuit according to claim 1 wherein said first control signal generating means generates said first control signal with an amplitude that decreases when rising clock edges from said output terminal lag corresponding edges on said input terminal by less than one clock cycle, and vice versa; and said second control signal generating means generates said second control signal with an amplitude that increases when falling clock edges from said output terminal lag corresponding edges on said input terminal by less than one clock cycle, and vice versa.

6. A clock deskew circuit according to claim 1 wherein said first control signal generating means generates said first control signal with an amplitude that decreases when rising clock edges from said output terminal lag corresponding edges on said input terminal by less than one clock cycle, and vice versa; and said second control signal generating means generates said second control signal with an amplitude that increases when falling clock edges from said output terminal follow preceding rising clock edges by less than one-half clock cycle, and vice versa.

7. A clock deskew circuit according to claim 1 wherein said first control signal generating means includes a first capacitor and a first plurality of serially connected transistors which generate said first control signal by charging and discharging said first capacitor, and said second control signal generating means includes a second capacitor and a second plurality of serially connected transistors which generate said second control signal by charging and discharging said second capacitor.

8. A clock deskew circuit according to claim 1 wherein said delay means includes a plurality of serially coupled stages with each stage including means for delaying said rising clock signal edges and falling clock signal edges independently in response to said first control signal and said second control signal respectively.

9. A clock deskew circuit according to claim 8 wherein in each stage said means for delaying includes a capacitor, and transistors which charge said capacitor at a rate which is inversely proportional to the magnitude of said second control signal and which discharge said capacitor at a rate which is proportional to the magnitude of said first control signal.

10. A clock deskew circuit according to claim 1 wherein said delay module and said control modules are integrated circuits on a single semiconductor chip.

* * * * *